(12) United States Patent
Jonsson et al.

(10) Patent No.: US 8,185,333 B2
(45) Date of Patent: May 22, 2012

(54) AUTOMATED LOAD ASSESSMENT DEVICE AND METHOD

(75) Inventors: Karl S. Jonsson, Rancho Santa Margarita, CA (US); Sonny Windstrup, Sollerodgade (DK)

(73) Assignee: Greenwave Reality, PTE, Ltd., Singapore (SG)

( * ) Notice: Subject to any disclaimer, the term of this patent is extended or adjusted under 35 U.S.C. 154(b) by 78 days.

(21) Appl. No.: 12/795,629

(22) Filed: Jun. 7, 2010

(65) Prior Publication Data

US 2011/0098867 A1    Apr. 28, 2011

Related U.S. Application Data

(60) Provisional application No. 61/261,707, filed on Nov. 16, 2009, provisional application No. 61/254,709, filed on Oct. 25, 2009.

(51) Int. Cl.
- *G01R 21/00* (2006.01)
- *G01R 13/00* (2006.01)
- *G05D 3/12* (2006.01)
- *G08B 21/00* (2006.01)

(52) U.S. Cl. ............... 702/66; 700/295; 702/60; 702/61; 702/73; 340/656; 340/660

(58) Field of Classification Search .................. 700/295; 702/60–61, 66, 73; 307/141, 37; 709/201; 340/656, 660

See application file for complete search history.

(56) References Cited

U.S. PATENT DOCUMENTS

| | | | |
|---|---|---|---|
| 4,858,141 A * | 8/1989 | Hart et al. ................. 702/61 |
| 5,258,656 A * | 11/1993 | Pawlick ................. 307/141 |
| 5,301,122 A * | 4/1994 | Halpern ................. 702/62 |
| 5,483,153 A * | 1/1996 | Leeb et al. ............. 324/76.12 |
| 5,650,771 A | 7/1997 | Lee |
| 5,717,325 A * | 2/1998 | Leeb et al. ............. 324/76.12 |
| 5,754,963 A * | 5/1998 | Nunneley et al. ....... 701/34 |
| 6,987,444 B2 * | 1/2006 | Bub et al. ............... 370/463 |
| 6,993,417 B2 * | 1/2006 | Osann, Jr. .............. 700/291 |
| 7,772,718 B2 * | 8/2010 | Lee et al. ............... 307/41 |
| 7,885,917 B2 * | 2/2011 | Kuhns et al. ........... 706/48 |
| 7,970,542 B2 * | 6/2011 | Bent et al. .............. 702/4 |
| 2006/0271544 A1 * | 11/2006 | Devarakonda et al. ... 707/9 |
| 2008/0094210 A1 * | 4/2008 | Paradiso et al. ........ 340/540 |
| 2009/0045804 A1 | 2/2009 | Durling et al. |
| 2009/0322159 A1 * | 12/2009 | Dubose et al. .......... 307/117 |
| 2010/0005331 A1 * | 1/2010 | Somasundaram et al. .. 713/340 |
| 2010/0076615 A1 | 3/2010 | Daniel et al. |
| 2010/0090542 A1 * | 4/2010 | Johnson et al. ......... 307/125 |

(Continued)

FOREIGN PATENT DOCUMENTS

WO    2007139587 A1    12/2007

(Continued)

OTHER PUBLICATIONS

A. Prudenzi, A Neuron Nets Based Procedure for Identifying Domestic Appliances Pattern of Use from Energy Recording at Meter Panel, IEEE, 2002.*

(Continued)

*Primary Examiner* — Albert Decady
*Assistant Examiner* — Darrin Dunn
(74) *Attorney, Agent, or Firm* — Bruce A. Young

(57) ABSTRACT

A device for automatically assessing the nature of an electrical load includes electrical transducers.

20 Claims, 10 Drawing Sheets

U.S. PATENT DOCUMENTS

| | | | |
|---|---|---|---|
| 2010/0145542 A1* | 6/2010 | Chapel et al. | 700/295 |
| 2010/0191487 A1* | 7/2010 | Rada et al. | 702/60 |
| 2010/0271222 A1 | 10/2010 | Kerrigan et al. | |
| 2011/0031819 A1* | 2/2011 | Gunwall | 307/141.4 |
| 2011/0153246 A1 | 6/2011 | Donaldson et al. | |

FOREIGN PATENT DOCUMENTS

| | | |
|---|---|---|
| WO | 2009103998 A2 | 8/2009 |
| WO | 2011050297 A2 | 4/2011 |
| WO | 2011/055122 A1 | 5/2011 |

OTHER PUBLICATIONS

Cheng J.W.M.; Kendall, Gail; Leung, J.S.K.; , "Electric-Load Intelligence (E-LI): Concept and Applications," TENCON 2006. 2006 IEEE Region 10 Conference , vol., No., pp. 1-4, Nov. 14-17, 2006 doi: 10.1109/TENCON.2006.343687 URL: http://ieeexplore.ieee.org/stamp/stamp.jsp?tp=&arnumber=4142265&isnumber=4142121 retrieved on Jul. 6, 2011.

Najmeddine, H.; et al. , "State of art on load monitoring methods," Power and Energy Conference, 2008. PECon 2008. IEEE 2nd International , vol., No., pp. 1256-1258, Dec. 1-3, 2008 doi: 10.1109/PECON.2008.4762669 URL: http://ieeexplore.ieee.org/stamp/stamp.jsp?tp=&arnumber=4762669&isnumber=4762428 retrieved on Jul. 6, 2011.

Chang, Hsueh-Hsien; et al. , "Load recognition for different loads with the same real power and reactive power in a non-intrusive load-monitoring system," Computer Supported Cooperative Work in Design, 2008. CSCWD 2008. 12th International Conference on , vol., No., pp. 1122-1127, Apr. 16-18, 2008 doi: 10.1109/CSCWD.2008.4537137 URL: http://ieeexplore.ieee.org/stamp/stamp.jsp?tp=&arnumber=4537137&isnumber=4536938 retrieved on Jul. 6, 2011.

Lam, H.Y.; Fung, G.S.K.; Lee, W.K.; , "A Novel Method to Construct Taxonomy Electrical Appliances Based on Load Signaturesof," Consumer Electronics, IEEE Transactions on , vol. 53, No. 2, pp. 653-660, May 2007 doi: 10.1109/TCE.2007.381742 URL: http://ieeexplore.ieee.org/stamp/stamp.jsp?tp=&arnumber=4266955&isnumber=4266888 retrieved on Jul. 6, 2011.

Leung, S.K.J., "Identifying Appliances Using Load Signatures and Genetic Algorithms," International Conference on Electrical Engineering, Hong Kong, Jul. 2007 http://www.icee-con.org/papers/2007/Oral_Poster%20Papers/01/ICEE-031.pdf retrieved on Jul. 6, 2011.

Chang, Hsueh-Hsien, "Load Identification of Non-intrusive Load-monitoring System in Smart Home," WSEAS Transactions on Systems, Issue 5, vol. 9, May 2010, pp. 498-510 http://www.wseas.us/e-library/transactions/systems/2010/42-415.pdf retrieved on Jul. 1, 2011.

Chang, Hsueh-Hsien; et al. , "Load Identification in Neural Networks for a Non-intrusive Monitoring of Industrial Electrical Loads," Proceedings of CSCWD (Selected Papers), 2007. pp. 664-674 http://wenku.baidu.com/view/d3429cf24693daef5e73dec.html retrieved on Jul. 1, 2011.

Lisovich, M; Wicker, S., "Privacy Concerns in Upcoming Residential and Commercail Demand-Response Systems," IEEE Proceedings on Power Systems, vol. 1, No. 1, Mar. 2008 http://www.truststc.org/pubs/332/lisovich2007pci_v3.pdf retrieved on Jun. 30, 2011.

Srinivasan, D.; Ng, W.S.; Liew, A.C.; , "Neural-network-based signature recognition for harmonic source identification," Power Delivery, IEEE Transactions on , vol. 21, No. 1, pp. 398-405, Jan. 2006 doi: 10.1109/TPWRD.2005.852370 URL: http://ieeexplore.ieee.org/stamp/stamp.jsp?tp=&arnumber=1564224&isnumber=33198 retrieved on Jul. 6, 2011.

Hart, G. W, Nonintrusive appliance load monitoring, Porceedings of the IEEE, vol. 80, No. 12, Dec. 1, 1992, pp. 1870-1891, IEEE, New York, NY, US.

James Turner, "The Smart Power Strip," IEEE Spectrum, Mar. 2010, pp. 22-25, IEEE, United States of America. (Web version URL http://spectrum.ieee.org/geek-life/hands-on/the-smart-power-strip viewed May 10, 2010.).

International Search Report and Written Opinion for PCT/US2010/053814, European Patent Office, Jun. 22, 2011.

* cited by examiner

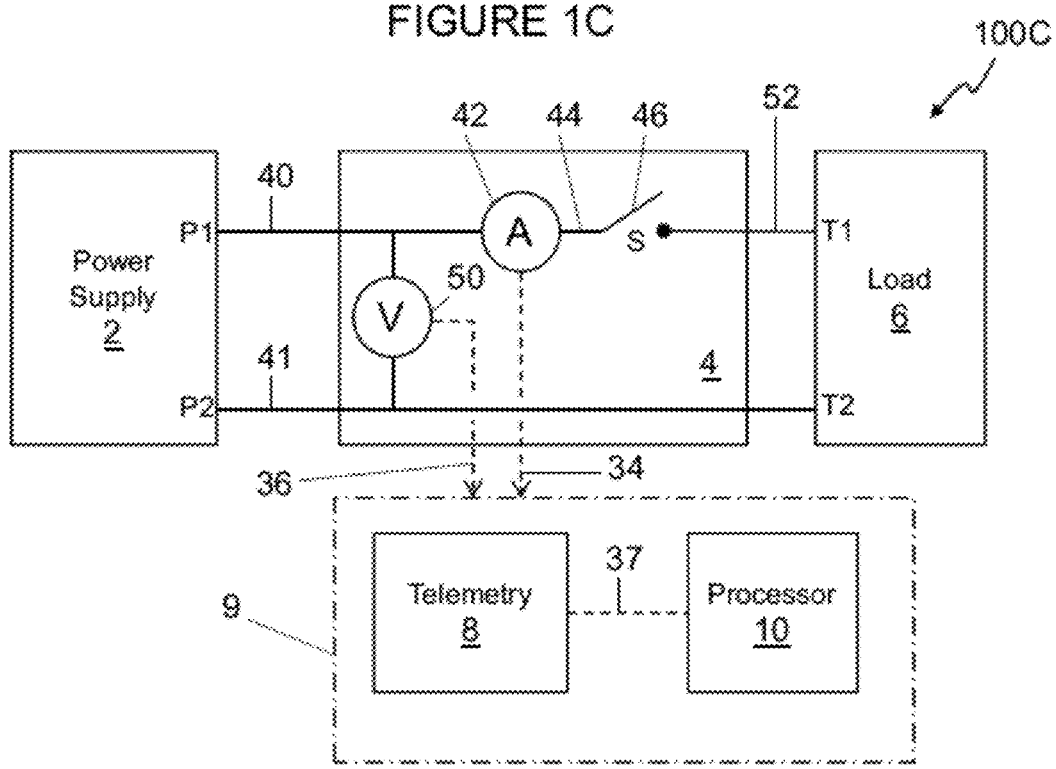

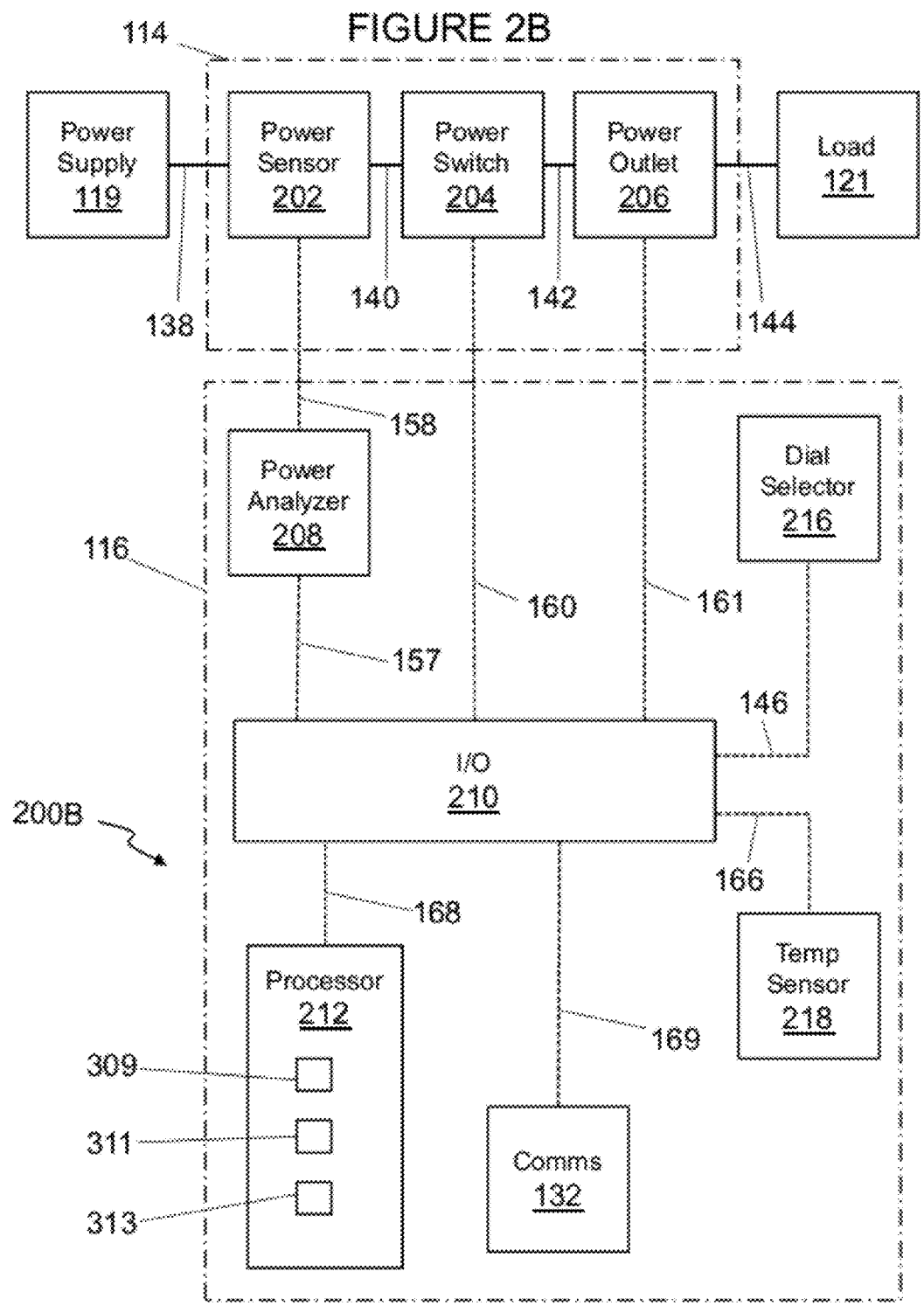

FIGURE 7

| Device | Measurements | | Analysis | | |
|---|---|---|---|---|---|
| | Inputs | Outputs | Basic Analysis | Intermediate Analysis | Advanced Analysis |
| 1. Voltage transducer | a) Instantaneous voltage from voltage transducer | Voltage<br>-Instantaneous<br>-RMS | | | Load current vs time when operating current is initially applied to the load; a Fourier transform of this data |
| 2. Current transducer | b) Instantaneous current from current transducer | Current<br>-Instantaneous<br>-RMS | Current<br>-Peak v. RMS | | Load voltage vs time when operating current is initially removed from the load; a Fourier transform of this data |
| 3. Power Analyzer | | Power<br>-real<br>-apparent<br>-reactive<br>-fundamental | Power Consumption<br>-standby<br>-operating<br>-power factor | Power Consumption Over Extended Time Interval<br>-frequency of use<br>-time duration each use | |
| | a) Temperature from temperature transducer | Temperature | | | |
| 2. Insertion Switch | a) Plug insertion | Open/closed contact (plug inserted) | Plug inserted | | |
| 3. Dial Selector | a) Switch position selection | Room location<br>Neighbor Appliances<br>Time of Use<br>Type of power strip (single outlet or multiple outlets) | Room location<br>Neighbor Appliances<br>Time of Use<br>Type of power strip | | |

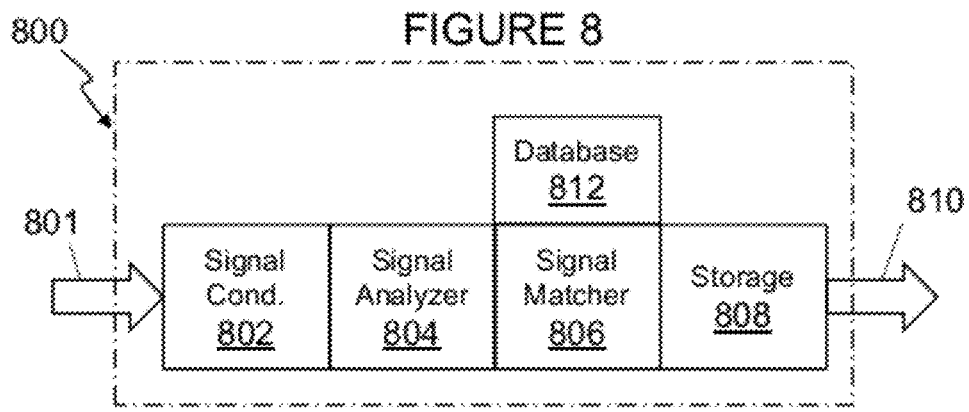
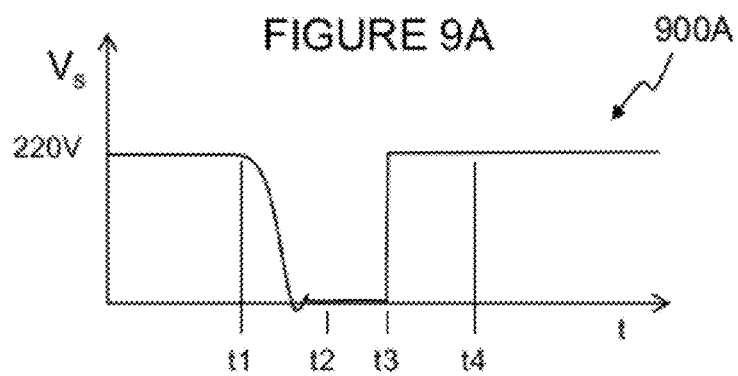
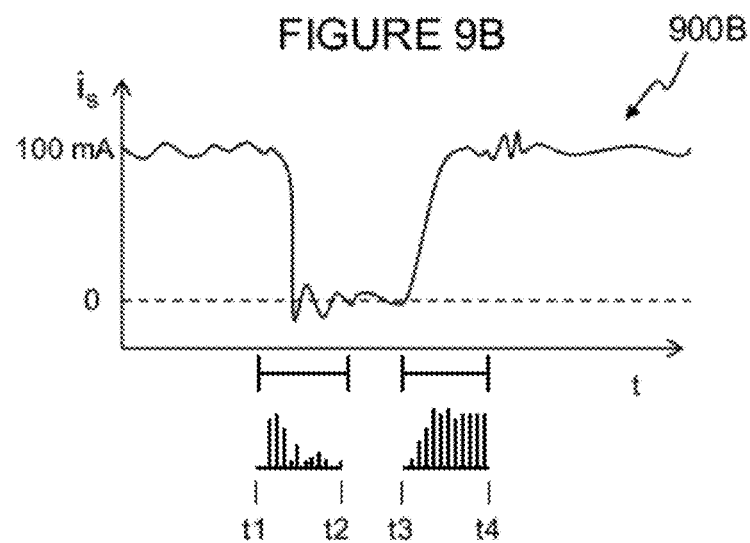

~444 ms

AUTOMATED LOAD ASSESSMENT DEVICE AND METHOD

PRIORITY CLAIM

This application claims the benefit of U.S. Prov. App. No. 61/254,709 filed Oct. 25, 2009 and U.S. Prov. App. No. 61/261,707 filed Nov. 16, 2009.

INCORPORATION BY REFERENCE

The disclosures of U.S. Prov. App. No. 61/254,709 filed Oct. 25, 2009 and U.S. Prov. App. No. 61/261,707 filed Nov. 16, 2009 are incorporated, in their entireties and for all purposes, herein by reference.

BACKGROUND OF THE INVENTION

1. Field of the Invention

The present invention relates to an apparatus and method for assessing electrical loads. Among other things, the device enables matching electrical loads with electrical appliances.

2. Discussion of the Related Art

Management of electric energy consumption is improved where electric consumers appreciate the relationship between the use of particular electric appliances and their electric bill. The utility company's revenue meter provides this information in a summary fashion reported to the customer each month. However, this summary electric power consumption data fails to identify the consumption of particular loads and fails to suggest how this consumption might be better managed.

SUMMARY OF THE INVENTION

A device for assessing a nature of an electrical load may include a transducer block interposed between a power supply and the electrical load, a signal electronics section operative to receive data from the transducer block, and a dial selector switch for selecting among three or more environmental variables. One or more processors may be operative to create indicia from the data received from the signal electronics section and a state of the dial selector switch. A processor of the one or more processors may be operative to match the indicia with stored indicia, and a processor of the one or more processors may be operative to assess the nature of the electrical load from the matched indicia.

A method for assessing a nature of an electrical load may include providing a transducer block interposed between a power supply and an electrical load, providing a signal electronics section operative to receive data, and providing a dial selector switch for selecting among three or more environmental variables. One or more processors may be used for determining indicia based on the data received from the signal electronics section and a state of the dial selector switch with a processor of the one or more processors comparing indicia with stored indicia, and a processor of the one or more processors assessing the nature of the electrical load based on the compared indicia.

BRIEF DESCRIPTION OF THE DRAWINGS

The present invention is described with reference to the accompanying figures. These figures, incorporated herein and forming part of the specification, illustrate the invention and, together with the description, further serve to explain its principles enabling a person skilled in the relevant art to make and use the invention.

FIG. 1C is a more detailed block diagram of a second embodiment of the automated load assessment device of FIG. 1A.

FIG. 2B shows a first schematic diagram of a load assessment device of FIG. 2A.

FIG. 7 shows a table of measurements and analysis associated with use of the device of FIG. 2A.

FIG. 8 shows signal analysis functions located in a processing unit associated with the device of FIG. 2A.

FIGS. 9A-B show voltage versus time and current versus time charts associated with the device of FIG. 2A.

DETAILED DESCRIPTION OF THE PREFERRED EMBODIMENTS

The disclosure provided in the following pages describes examples of some embodiments of the invention. The designs, figures, and description are non-limiting examples of certain embodiments of the invention. For example, other embodiments of the disclosed device may or may not include the features described herein. Moreover, disclosed advantages and benefits may apply to only certain embodiments of the invention and should not be used to limit the disclosed invention.

To the extent parts, components and functions of the described invention exchange electric power or signals, the associated interconnections and couplings may be direct or indirect unless explicitly described as being limited to one or the other. Notably, connected parts, components and functions may have interposed devices and/or functions known to persons of ordinary skill in the art.

Figure 1A:
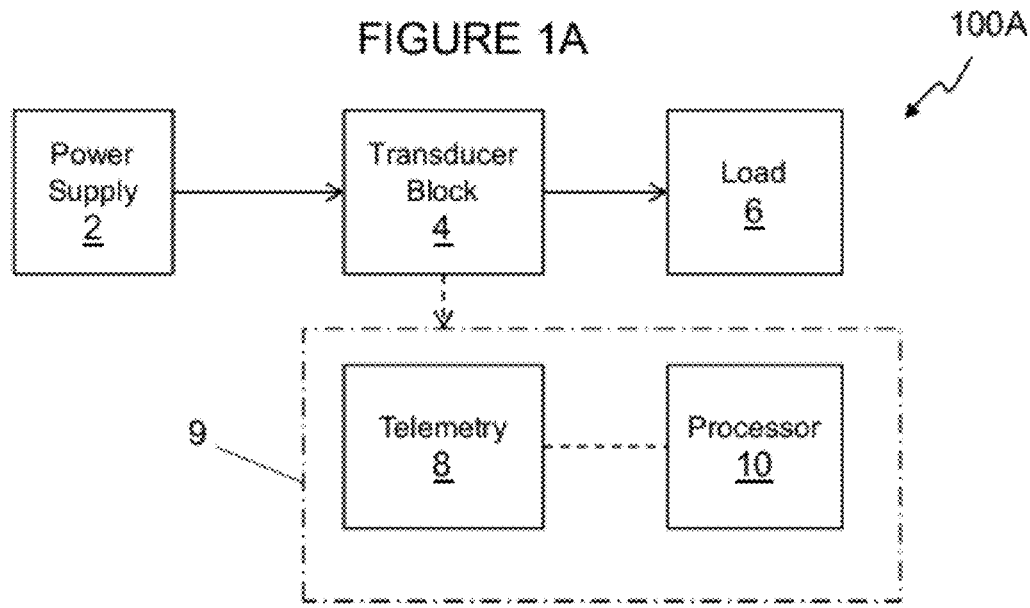
FIG. 1A is a block diagram of an automated load assessment device in accordance with the present invention.

FIG. 1A shows an embodiment of the automated load assessment invention 100A. A transducer block 4 is coupled to each of a power supply such as a mains supply 2 and a load such as a household appliance 6. Data derived from the transducer block is forwarded to a signal electronics section 9 that includes a telemetry block 8 and a processing unit 10.

In various embodiments, the telemetry block 8 includes one or more of electrical interconnections, signal input/output devices, signal conditioners, signal analyzers, and signal transmission means known to persons of ordinary skill in the art including wired and wireless devices (wired, such as Ethernet or other IEEE 802 wired standards; wireless, such as 802.11 a/b/g/n or other IEEE 802 wireless standards, or Zigbee, or Z-Wave; or, power line communications, such as INSTEON® and X10 networks. IEEE 802.x, Zigbee).

In some embodiments, explained more fully below, the transducer block includes one or more of voltage transducer(s), current transducer(s), frequency transducers(s) and phase angle transducers(s). And, in some embodiments, explained more fully below, the transducer block includes one or more of a power analyzer, I/O block, dial selector switch, temperature sensor, electrical outlet and outlet insertion switch.

Figure 1B:
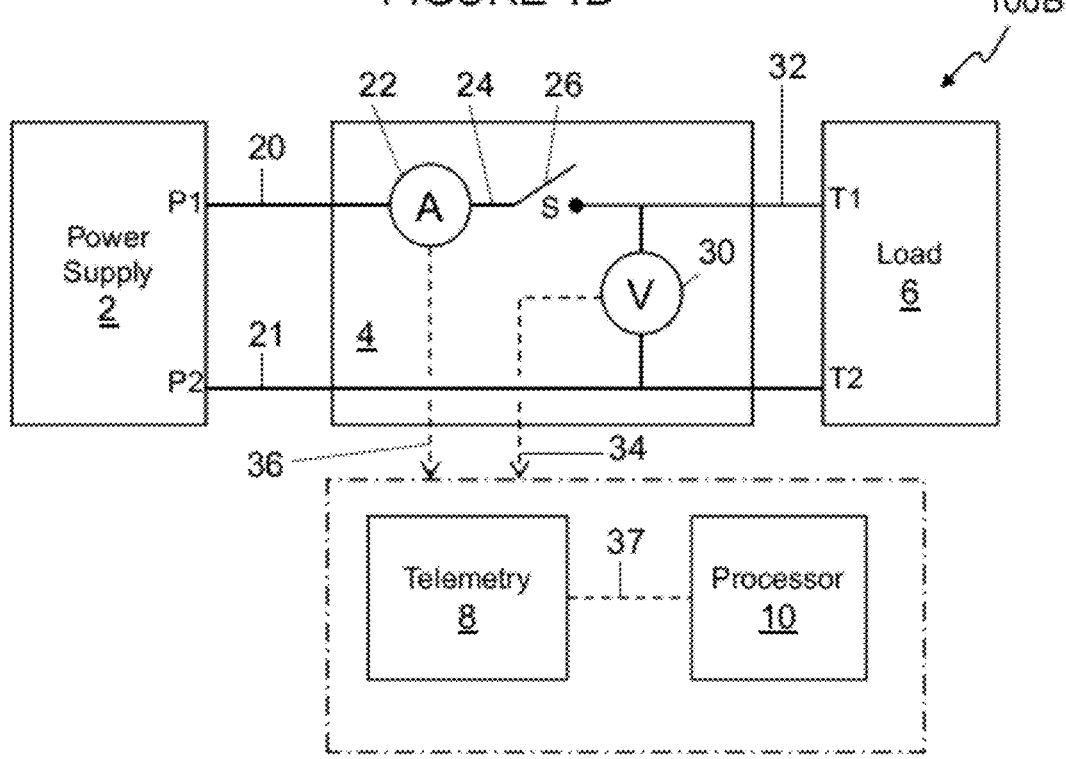
FIG. 1B is a more detailed block diagram of a first embodiment of the automated load assessment device of FIG. 1A.

FIG. 1B shows an embodiment of the invention capable of measuring load voltage decay including two transducers 100B. Here, a first current path between the power supply 2 and the load 6 includes a) a first conductor 20 interconnecting the power supply and a current transducer 22, b) a second conductor 32 interconnecting a first terminal of the load T1 and a switch 26, and c) a third conductor 24 interconnecting the current transducer and the switch. A fourth conductor 21 provides a second current path between the power supply 2 and a second terminal of the load T2. A voltage transducer 30 is connected in parallel across first and second terminals of the load.

FIG. 1C shows an embodiment of the invention capable of measuring a common supply voltage 100C. For example, even where the power supply 2 serves multiple loads 6, a single voltage measurement 50 determines the voltage supplied to each load. Here, a first current path between the power supply 2 and the load 6 includes a) a first conductor 40 interconnecting the power supply and a current transducer 42, b) a second conductor 52 interconnecting a first terminal of the load T1 and a switch 46, and c) a third conductor 44 interconnecting the current transducer and the switch. A fourth conductor 41 provides a second current path between the power supply 2 and a second terminal of the load T2. A voltage transducer 50 is connected in parallel across power supply terminals P1, P2.

Means for signal communication such as wired or wireless media 34, 36 enable transport of signals derived from the current transducers 22, 42 and voltage transducers 30, 50 to a signal electronics section 9 that includes a telemetry block 8 and a processor block 10. And, means for signal communication such as wired or wireless media 37 enable transport of signals derived from the current and voltage transducers between any of the telemetry block, processing unit 10, and remote devices discussed more fully below. In some embodiments, signals derived from the current and voltage transducers are conditioned. For example, where signal conditioning is used, the signal conditioning can occur in one or more of the current transducer, the voltage transducer, the telemetry block, and the processor. As used here, signal conditioning refers to preparation of the signal for transmission and/or analysis including, for example, amplification and filtering, such as band pass filtering.

In various embodiments, the processing unit 10 includes a signal analysis function implemented in one or more of a general purpose computer running signal analysis software and off-the-shelf hardware designed for signal analysis. For example, computer software for performing Fourier Transforms is well known in the computer arts and is available off the shelf from suppliers such as FFTW at www.fftw.org. In addition, curve fitting software including least squares methods may be used as described in *Fitting Equations to Data, Computer Analysis of Multifactor Data* by Cuthbert Daniel et al. Wiley Classics Library, John Wiley And Sons, August 1999.

In addition, off-the-shelf hardware for signal analysis is well known in the computer arts and is available from a variety of manufacturers including for example, Texas Instruments 'C5000 line of digital signal processors such as the TMS320V5504 and 'C5505 which include on-chip memory, a USB 2.0 interface, hardware Fast Fourier Transform (FFT), a UART, an LCD interface and I/O support.

The load assessment device 100A of the present invention may be integrated and/or packaged in various embodiments having one or more primary functions. In some embodiments, the load assessment device 100A provides primarily the load assessment function. In other embodiments, the load assessment device provides both the load assessment function and electric power interconnection functions as in a power strip with one or multiple outlets. In still other embodiments, the load assessment device is distributed with transducer and processing functions remote from one another. Several of these embodiments are discussed below.

Figure 2A:
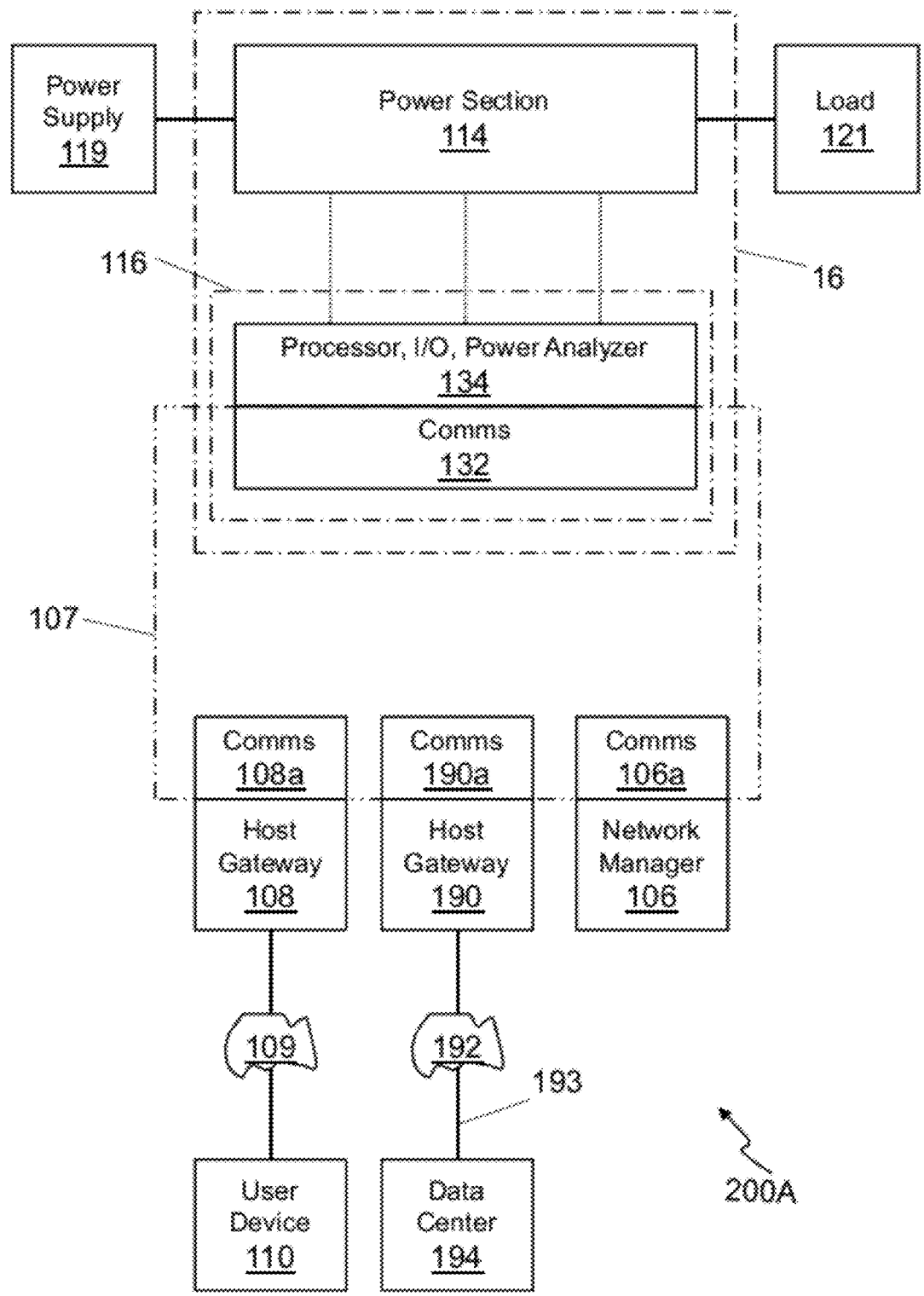
FIG. 2A shows a schematic diagram a load assessment system including an automated load assessment device.

FIG. 2A shows an exemplary networked load assessment system and device 200A. In an embodiment, one or more load assessment devices 100A include respective power 114 and signal 116 electronics sections (electronics for one load assessment device shown). In some embodiments the power and signal electronics sections are partially or totally enclosed in a housing 16. Within the signal electronics section 116 is a communications and control means 132 for exchanging data with a local network 107. Also within the signal electronics section is a processor, input/output, and power analyzer means 134. The network may be any suitable network known to persons of ordinary skill in the art including; wired, such as Ethernet or other IEEE 802 wired standards; wireless, such as 802.11 a/b/g/n or other IEEE 802 wireless standards, or ZigBee®, or Z-Wave®; or, power line communications, such as INSTEON® and X10® networks. In one embodiment a Zigbee mesh network is used. And, in one embodiment a Z-Wave mesh network is used.

In some embodiments, the communications means 132 includes a power line communications ("PLC") device such as a PLC modem for communicating with a gateway 108a, 190a that is also equipped with a PLC device, the two PLC devices being coupled for communication via electric power lines such as the electrical wiring of a building or structure. In an embodiment, an Ethernet switch in the load assessment device 100A is coupled to the load assessment device PLC and provides one or more Ethernet connections such as an Ethernet connection enabling functions of the load assessment device and an Ethernet connection available to devices external to the load assessment device.

In various embodiments, a networked load assessment device 100A utilizes the network to communicate with other devices. For example, a host gateway device 108 having a means for communicating with the network 108a can transmit commands to or receive data from a load assessment device 100A. In this embodiment, a user device and/or processor 110 with a connection to the gateway 109, such as a controller, a special purpose controller, a personal computer, or a special purpose computer, is capable of issuing commands to or receiving data from a load assessment device via the local network 107. In some embodiments, the host gateway includes one or more of the user device functions. Connections between the user device and the gateway 109 can use any suitable wired or wireless connection including the network connection types mentioned above.

A gateway 108 is configured in various embodiments to handle known TCP/IP based devices utilizing, for example, an IP based API available from the gateway. In an embodiment, the gateway uses a simple SSDP discovery daemon allowing IP devices on the network 107 to find it. Typical TCP/IP devices include one or more of an iPhone®, iPad™, iPod®, network connected tablet, TV, bluray player, and the like.

In some networked embodiments, a network management device 106 having a means for communicating with the network 106a, such as a network coordinator or network controller, is included for implementing network management functions. Network management functions can include, among other things, maintaining a list of interconnected devices and maintaining routing tables. In particular, network coordinators are used with Zigbee networks and controllers are used with Z-Wave networks. Network management devices may supplement and/or duplicate the functionality provided by gateway device(s) 108 and their interconnected user devices 110.

And, in some networked embodiments, a second gateway 190 with second gateway communications block 190a and second gateway connection 192 interconnects via an external network 193 with a data center 194 (as shown). In other embodiments, the datacenter external network communicates via the host gateway connection 109.

In an exemplary system including a) one or more load assessment devices 100A, b) a host gateway 108 and c) a user device 110, each of these devices includes memory for storing a device identification code. Device identification codes enable messages to be routed to the correct device. In an embodiment, a common group or home identification code is used to enable communication among members of the group.

FIG. 2B shows a more detailed version 200B of the automated load assessment device of FIG. 2A. The device includes a signal electronics section 116 and a power electronics section 114.

Signal electronics include an input/output ("I/O") block 210 coupled to each of a processor and memory block 212, and a communications block 132. In various embodiments, one or more of a power analyzer block 208, a dial selector block 216 and a temperature sensor block 218 are coupled to the I/O block. And, in some embodiments, an Ethernet switch is included in the communications block 132 or in addition to the communications block 132.

In various embodiments of the signal electronics section 114, a wireless module such as a Z-Wave or Zigbee module is used to implement the I/O block 210, processor block 212, and communications block 132. For example, a Sigma Designs ZM3102 Z-wave module is used in one embodiment and a ZigBee chipset is used in another embodiment. In some embodiments, the input/output functionality is enhanced with a general purpose I/O expander integrated circuit such as an NXP PCA9534BS 8-bit I2C-bus and SMBus low power I/O port with interrupt.

In an embodiment, a metering system 309 is implemented in the processor 212. The metering system totalizes power consumption for each outlet 206 to produce a meter report. In some embodiments an over current protection system ("OCPS") 313 is implemented in the processor. The over current protection system compares measured current for each socket 206 and for all sockets against safety limits and disconnects offending appliances in case of excess loads. And, in some embodiments, a change detection system ("CDS") 311 is implemented in the processor. These systems are discussed more fully below.

In an embodiment, a power/energy integrated circuit such as a Cirrus Logic CS 5463 integrated circuit is used to implement the power analysis functionality of the power analyzer block 208. Power consumption and other data available from the power analysis device includes one or more of real/active power, RMS values of current and voltage, apparent power, reactive power, fundamental power, and temperature sensing. As will be understood by a person of ordinary skill in the art, waveform profiles of one or more of voltage, current, and power can be constructed by any processor in signal communication with the I/O block 210.

The power section 114 includes a power sensor block 202, a power switch block 204, and a power outlet block 206. The power sensor block is coupled to a power source 119 via a first power circuit 138. The switch block 204 is coupled to the power sensor block via a second power circuit 140 and to an outlet 206 via a third power circuit 142. A load 121 is coupled to the outlet via a fourth power circuit 144.

The power analyzer is coupled to the power sensor block 202 via signal line 158 and to the I/O block via signal line 157. Switch block 204 is coupled to the I/O block by signal line 160. Outlet block 206 is coupled to the I/O block via signal line 161.

The processor block is coupled to the I/O block 210 via a signal line 168. Where used, dial selector block 216 is coupled to the I/O block via a signal line 146 and temperature sensor block 218 is coupled to the I/O block via a signal line 166. The communications block is coupled to the I/O block via a communications signal line 169.

Figure 3:
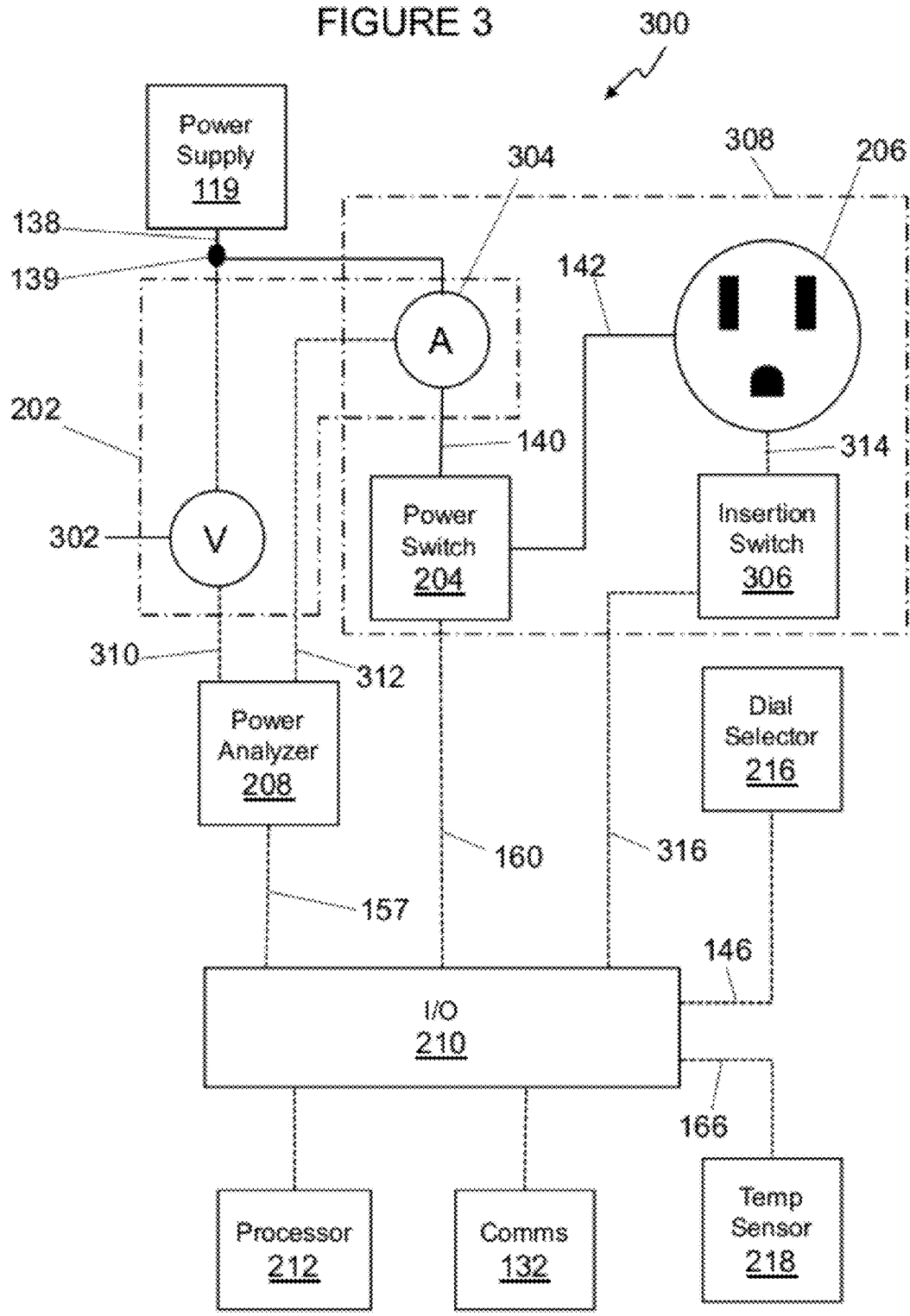
FIG. 3 shows a second schematic diagram of the device of FIG. 2A.

FIG. 3 shows an automated load assessment device having a single outlet 300. In an embodiment, the load assessment device integrates with an electric power strip such as a single or multiple outlet power strip interconnected with an electrical plug via an electric cable. The single outlet embodiment provides a single power channel 308 including an outlet 206, a power switch 204 and a current transducer 304. The power channel receives electric power via a bus tap 139 on a power bus 138. In other embodiments, a plurality of power channels provide for respective outlets in multi-outlet load assessment devices.

Power supplied to the outlet 206 is sensed by a power bus voltage transducer 302 and the power channel current transducer 304, together the power sensor block 202. Voltage and current transducer output signal lines 310, 312 are coupled to the power analyzer block 208 which is coupled to the I/O block 210.

In an embodiment, a voltage transducer 302 measures the load assessment device bus voltage. Here, the power supplied to each outlet is known since outlet voltage and respective outlet currents are known (see similar arrangement in FIG. 1C above). Further, the power being supplied to the load assessment device 300 from the power supply 119 is approximately equal to the power drawn by all of the load assessment device outlets and is also known.

In some embodiments, the voltage at each outlet is monitored by a respective voltage transducer located between the outlet and the power switch 204 (see similar arrangement in FIG. 1B above). This embodiment provides for, inter alia, measuring a load's voltage decay after the power switch is opened.

Interposed between the power supply 119 and the outlet 206 is a power switch 204. A power switch signal line 160 couples the I/O block 210 with the power switch. The switch may be any switch known in the art that allows for automated control, such as a mechanical or solid state relay, or a semiconductor switch. In one embodiment, a latching type relay is used and in another embodiment a TRIAC type switch is used.

The outlet 206 is coupled to a power output of the power switch 204 via the third power circuit 142. In some embodiments, an insertion switch 306 senses via signal line 314 whether a plug is inserted in the outlet 206 and provides an insertion signal via signal line 316 to the I/O block 210 (see FIG. 2A).

In an embodiment, consumption of each connected load or appliance 121 is monitored during appliance standby periods such that standby power consumption is measured. Typically, an appliance's standby power level is the lowest non-zero level power consumption associated with the appliance. Here, gateway and/or user device 108, 110 selections enable the user to interrupt power flow to an appliance in a standby mode. In some embodiments, the user can define a standby time period which if exceeded, automatically opens the associated power switch 204 to interrupt the appliance standby power flow.

Plug insertion sensing may be accomplished by any means/device known to persons of ordinary skill in the art. For example, various embodiments employ a capacitive sensor, an optical sensor, and a mechanical sensor. All of these devices are referred to herein as an "insertion switch."

Figure 4:
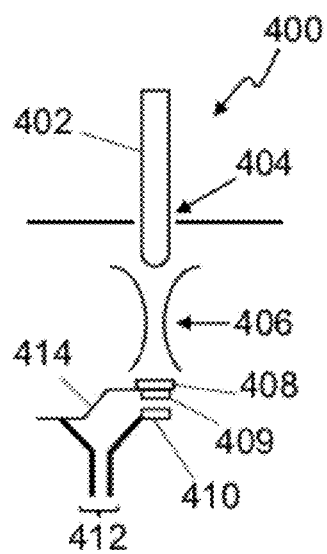
FIG. 4 shows a schematic diagram of an insertion switch of the device of FIG. 2A.

FIG. 4 shows an electro-mechanical insertion switch 400. This switch utilizes a spring arm 414 that is depressed by the blade of a plug 402 when the blade is inserted in the outlet opening 404 and between spring contacts 406 of an outlet power circuit. The inserted blade contacts a pressure pad such as an insulator 408 at one end of the spring arm and pushes a moving contact 409 against a stationery contact 410 closing the circuit 412. The closed circuit is the signal that a plug has been inserted in the outlet 206.

In some embodiments (see FIG. 2B), a dial selector 216 is coupled to the I/O block 208. The dial selector provides a means for selecting an environmental variable through the use of symbols, letters, numbers, colors, or other indicia associated with dial selector positions. For example, one setting might be used for a load assessment device located in a home theatre while another setting might be used in bedroom. Environmental variables are used in various embodiments to designate a particular room, a category of electrical loads such as home theatre, a predefined scene such as a conserve energy scene, a particular use such as entertainment, and a particular time or season such as 11 PM or winter.

Figure 5:
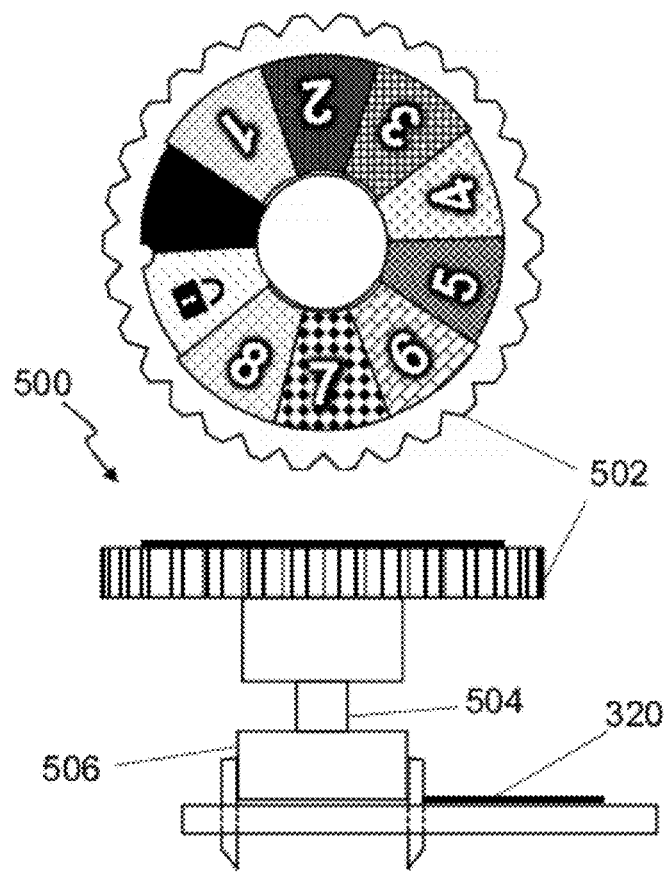
FIG. 5 shows schematic diagram of a dial selector of the device of FIG. 2A.

FIG. 5 shows one embodiment of a dial selector 500. A dial selector wheel 502 is used to rotate a shaft 504 that actuates a dial selector switch 506. Switch signals corresponding to selected states are coupled to the I/O block 208 via dial selector switch signal line 320. Any suitable switch known to persons of ordinary skill in the art may be used. Suitable switches include rotary and slider type switches and analog and digital switches. In an embodiment, a switch opens and closes circuits such as digital circuits corresponding to each switch position. In another embodiment, a binary coded decimal ("BCD") rotary switch is used. In yet another embodiment, an analog switch such as a potentiometer together with an analog to digital converter is used.

Where the dial selector 500 is used to designate location, an embodiment includes a multi-colored dial selector wheel 502 having eight colored segments arranged around the periphery of the wheel. In addition to the eight colored segments, black and white segments are included. Each segment corresponds to a switch 506 position. The colors indicate particular rooms or spaces within a home or another multi-space, multi-use environment such as an office suite or building. Black indicates a spare or user designated variable and white indicates a load assessment device monitoring only state where control functions are disabled.

In some embodiments (see FIG. 3), a temperature transducer 218 is used to sense a temperature of the environment where the load assessment device is located. Signals from the temperature transducer are coupled to the I/O block 210 via temperature transducer signal line 166.

Figure 6:
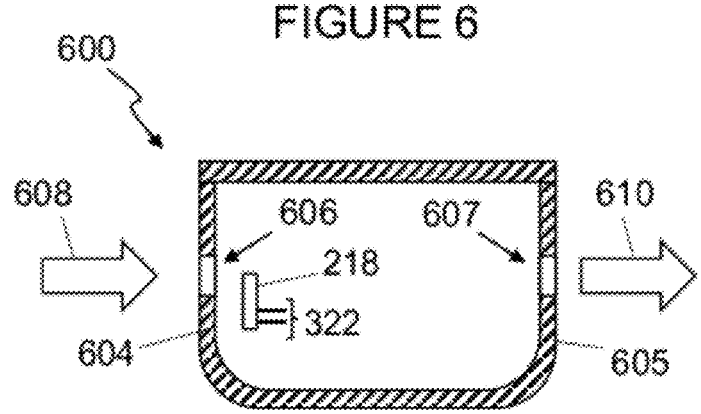
FIG. 6 shows a schematic diagram of a temperature transducer of the device of FIG. 2A.

FIG. 6 shows one embodiment of a temperature transducer located in a load assessment device housing 600. A first surface area of a housing 604 has an air inlet 606 and a second surface area of the housing 605 has an air exhaust 607. In various embodiments, the air inlet and exhaust are located to facilitate a natural draft 608, 610 through the housing such as a draft created by a heated electrical component. The temperature transducer 218 is located near the inlet and temperature transducer signals are coupled to the I/O block via temperature transducer signal line 322.

In an embodiment, the load assessment device 100A is capable of supplying power to a load or, in embodiments having multiple power channels 308, to multiple loads. Load control including switching loads on and off is enabled by network communications 107 between a command issuing device such as a user device 110, network manager 106, or data center 194, and a command receiving device for a particular load assessment device 100A. For example, a command issued from the user device to turn a particular outlet on is routed via the network to a particular load assessment device communications block 132. The load assessment device processor 212 receives the command from the I/O block 210, interprets the command, and sends the power switch 204 an on signal via the I/O block and signal line 160.

Outlets 206 are capable of being turned on and off by direct commands from a user as described above. Outlets can also be turned on and off under program control. For example, under program control an outlet's state may be selected based on one or more of time, a selected load, energy pricing, power consumption during a particular period of time, environmental conditions, or other data available to a processor in signal communication with the load assessment device I/O block 210.

Energy reporting and management functions are enabled by the bus voltage transducer 302, power channel current sensor 304, the outlet insertion switch 306, and the power analyzer 208. Power analyzer inputs include bus voltage sensed by the bus voltage transducer and outlet current(s) sensed for each power channel 308 by a respective power channel current transducer.

The power provided to each outlet 206 is know because the current supplied to each outlet is measured 304 and a single bus voltage that is common to all outlets is measured 302. From these measurements, the power analyzer 208 can send data to the I/O module 210 including instantaneous current and voltage. In various embodiments, the power analyzer can send additional data to the I/O module including one or more of real power, RMS voltage and current, apparent power, reactive power and fundamental power.

Data from the power analyzer 208 is available to any processor in signal communication with the I/O block 210. For example, a user device 110 can receive data from the power analyzer via the network 107. Instantaneous values, trends, and summaries of data are available from power analyzer data stored in the user device or another network accessible memory device, any of which can be reported to the user. In addition, outlet insertion switch 306 status is available to the I/O block, a first state indicating a plug is inserted in the outlet and a second state indicating no plug is inserted in the outlet.

In some embodiments, data from external sources, such as energy prices reported by an electric utility or electric system operator, are available whether manually entered or acquired from the network via a connection such as an internet connection via the data center 194 or an internet gateway. Using this electric rate/cost information and the electric consumption information, the user device is capable of reporting cost metrics such as instantaneous electric supply costs, summarized electric costs, period specific electric costs, and suggestions for lowering electric costs such as shifting electric loads to less costly times of the day.

In various embodiments, a processor in signal communication with the load assessment device, such as via a telemetry block 8 or I/O block 210, infers the nature of a load 6, 121 by analyzing data available from the load assessment device 100A, 100B, 100C, 200A, 200B, 300.

Analytical tools for inferring the nature of the load are referred to herein as Basic Analysis, Intermediate Analysis, and Advanced Analysis. To the extent an analytical tool incorporates a function requiring a processor, the function, or any portion thereof, may be executed in any processor the tool can communicate with including the processors numbered 10, 134, 194, 212. In addition, all such functions of a particular tool need not be executed in the same processor. Further, if such a function is subdivided, these smaller elements need not be executed on the same processor.

FIG. 7 shows output data derived from the load assessment device power analyzer 208, the insertion switch 306, and the dial selector 216. The figure also shows what output data used in each of the analytical tools.

Basic analysis uses power clues and contextual information to identify likely device classes for a load, typically a home appliance. As shown in FIG. 7, basic analysis considers standby and operational power consumption, power factor, and peak versus RMS current. In addition, one or more environmental factors including room location, neighbor appliances (in the same room), time of use, and type of power strip (single outlet or multiple outlet) are considered.

In basic analysis, load assessment typically utilizes a few data snapshots. For example, an appliance requiring 10 watts standby power and 200 watts operational power is located in a family room. These data fit the profile of a television and assuming no contra indication from the power factor and peak versus RMS currents, this load would likely be matched with a television.

Data for matching loads to appliances is in various embodiments maintained in storage accessible to the local network 107 or the external network 193. Local data storage devices include the gateway host 108 and the user device 110. External data storage devices include local and remote storage devices such as semiconductor and hard disc storage.

Once an outlet/load is matched to a particular appliance, there is no need to run the matching process again unless the appliance is unplugged. In various embodiments, the plug insertion switch 306 sets a flag when a plug is inserted in a respective outlet 206. A set flag results in the load assessment being run for the indicated outlet/load; once the assessment runs, the flag is cleared. With respect to a particular socket, removal of a plug and reinsertion of a plug resets the flag and causes the matching process to execute again.

In intermediate analysis examines patterns of use or behavior patterns to perform load assessments. In some embodiments, intermediate analysis measures load harmonics to perform load assessments. For example, identifying the existence of $2^{nd}$, $3^{rd}$ and higher harmonics and their absolute and relative magnitudes provides data that is matched against a database of known "harmonic signatures" to perform load assessment.

As shown in FIG. 7, intermediate analysis includes monitoring power consumption to determine a load's duty cycle including frequency of use and duration of use.

In intermediate analysis, load assessment utilizes data snapshots taken at a low frequency. For example, power consumption might be checked and recorded once per minute. If the load being monitored is turned on frequently and operates for an extended period such as one or more hours each time it is turned on, these data might again suggest the appliance is a television.

Data for matching use profiles can be stored on the local network 107 or external to the network. Local data storage devices include the gateway host 108 and the user device 110. External data storage devices include computers located in the datacenter 194.

Advanced analysis assumes each load has a characteristic electrical signature, for example the frequency content of its voltage and current waveforms.

In various embodiments, a processing unit in signal communications with the load assessment device I/O block 210, such as the gateway host 108 or a datacenter processor 194, includes signal analysis software or hardware for performing one or more of Fourier transforms and curve fitting.

FIG. 8 shows signal analysis functions implemented in a processing unit 800. A processing unit input 801 and a processing unit output 810 are shown. For example, the processing unit 212 might be located in the power strip, in the data center 194 or in another suitable location known to persons of ordinary skill in the art. Here, an incoming signal 801 such as a current or voltage waveform derived from a transducer 302, 304 or power analyzer 208 output is processed in a signal conditioning module 802 to remove unwanted signal content, such as 60 cycle power mains noise. In a signal analysis module 804, a signal derived from the incoming signal, such as an output of the signal conditioning module 802, is analyzed during assessment of the nature of the load 121.

In some embodiments, analytical results derived from the signal analysis module 804, referred to herein as "fingerprints," are used by a matching module 806. Available to the matching module is a database 812 including the "fingerprints" of a many loads such as air conditioners, portable electronics, televisions, computers and the like. In various embodiments, the fingerprint database may identify one or more of the types of load (e.g., HVAC, Electronics, Dishwasher . . . ), the manufacturer of the load (e.g., GE, Hitachi, Lennox . . . ), and the particular load (e.g., Model 3433Z Food Processor).

In the matching module, the fingerprint derived from the incoming signal 801 is compared with entries in the fingerprint database. Where a match is found, an assessment of the load 121 is available either from the database 812 or from related databases or information sources.

Some processing units 108, 194 include a memory for saving indicia that identify loads 121 that have been assessed. For example, an embodiment includes a storage device 808 for saving the indicia of at least one load. Yet another embodiment includes a storage device for saving the indicia of multiple loads such that in various embodiments, one processing unit and/or one storage device is capable of supporting multiple power channels 308.

In operation, a load 121 is fingerprinted during one or more of connecting the load to a power source, supplying power to the load, and disconnecting the load from a power source. In an embodiment, the load is fingerprinted by controlling its input power and measuring its behavior under selected conditions. For example, turning the load on and analyzing its current response immediately after the power is applied, then turning the load off and analyzing the voltage response immediately after the power is removed. In some embodiments, the on/off actions are synchronized with the peak or zero crossing of the applied AC voltage.

In one embodiment, a current flow fingerprint is obtained when a load 121 is energized. As shown in the voltage vs. time graph 900A of FIG. 9A, energizing a load at time $t=t_3$ causes the load voltage (voltage across terminals T1, T2) to rise from approximately zero volts to the supply voltage Vs. Corresponding to the voltage rise of FIG. 9A is a generally increasing current flow to the load shown between times $t_3$ and $t_4$ of FIG. 9B. As seen in FIG. 9B, current flow to the load ramps up during this time period and fluctuates within a band that is typically narrow compared to the band $0$-$i_s$.

Since data derived from the current transducer 304 is available to a processor 10, 134, 194, 212 the current flow data can be collected and analyzed during the inrush period between times $t_3$ to $t_4$. In an embodiment, a sample such as a burst sample of current flow "i" data is collected between times $t_3$ and $t_4$. The sample rate should be sufficient to provide a faithful representation of the signal being sampled. For example, in some embodiments the sample rate is greater than two times the highest expected signal frequency to prevent aliasing.

Figure 10A:
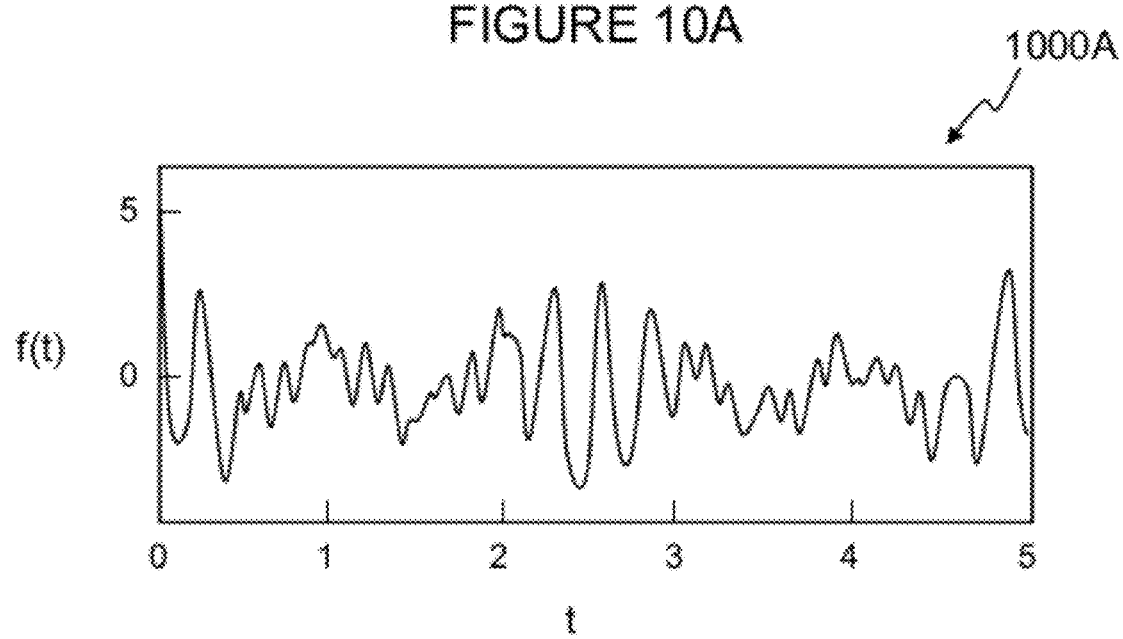
FIGS. 10A-B show signal versus time and amplitude versus frequency charts associated with the device of FIG. 2A.
Figure 10B:
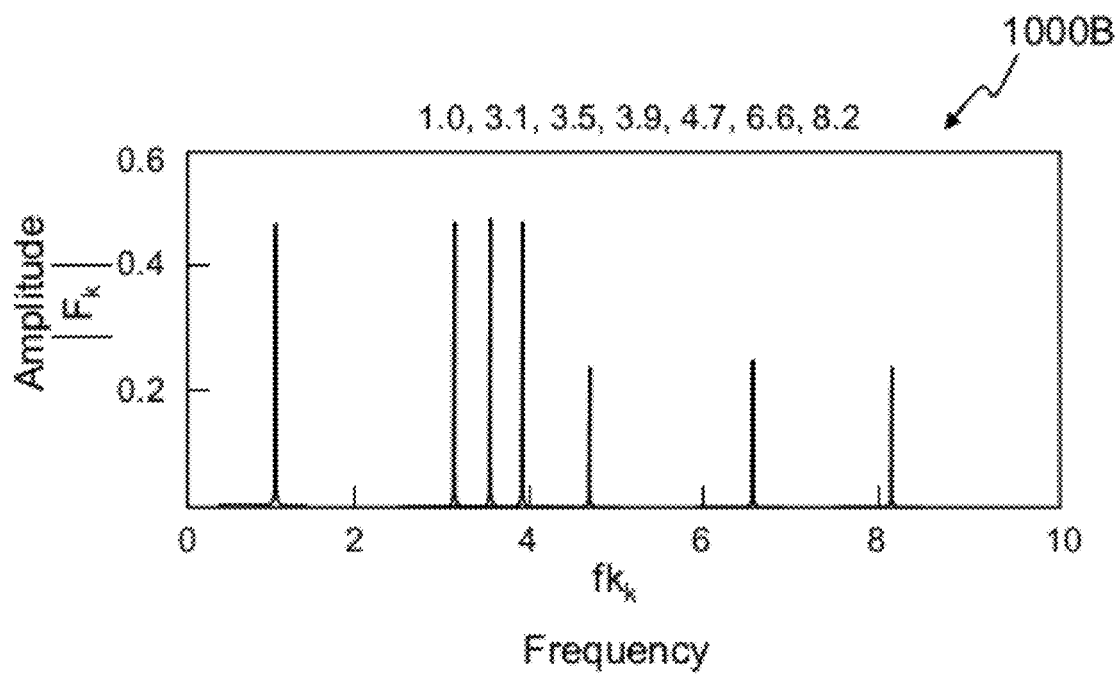

In an embodiment, the time domain current flow data samples are transformed into the frequency domain by a Fourier transform device of the processing unit 804. For example, FIG. 10A shows a signal f(t) in the time domain and FIG. 10B shows a representation of that signal abs($F_k$) in the frequency domain with frequency peaks at 1.0, 3.1, 3.5 . . . . In similar fashion, transformation of the current flow data samples into the frequency domain produces a set of frequency peaks if1, if2, if3 . . . . Here, these frequency peaks are a current flow fingerprint of the load.

In an embodiment, a voltage fingerprint is obtained when a load 121 is de-energized. As shown in the voltage vs time graph 900A of FIG. 9A, de-energizing a load at time $t=t_1$ causes the load voltage (voltage across terminals T1, T2) to generally fall from Vs, ultimately to about zero volts. During the time between $t_1$ to $t_2$, the voltage fluctuates in a voltage band that is generally narrow compared to the band 0-Vs. Notably, some loads with inductive elements may fluctuate over ranges exceeding 0-Vs due to, among other things, backlash voltages produced at the time the load is disconnected. Corresponding to the voltage rise of FIG. 9A is a generally decreasing current flow to the load 900B shown between times $t_1$ and $t_2$ of FIG. 9B.

Figure 11A:
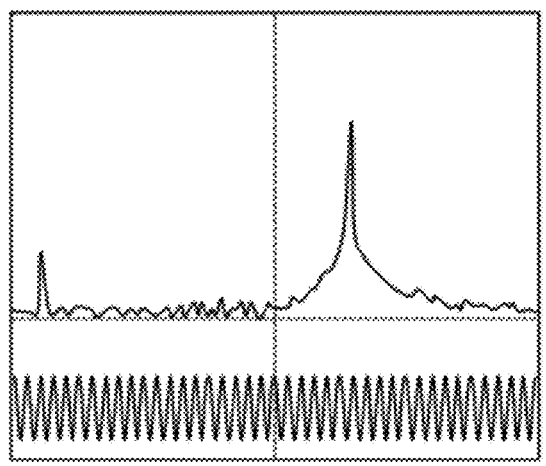
FIGS. 11A-C show oscilloscope traces including a time domain and frequency domain representations of a time domain signal.
Figure 11B:
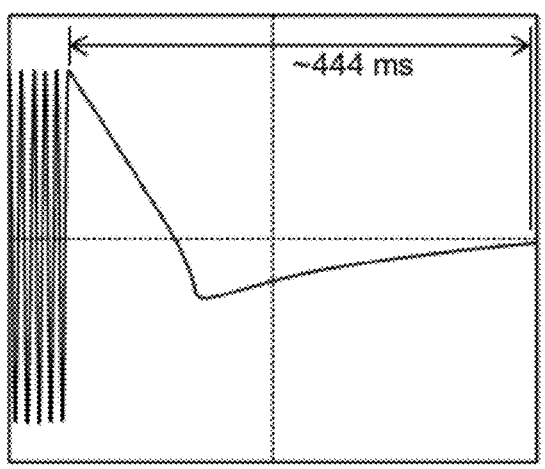
Figure 11C:
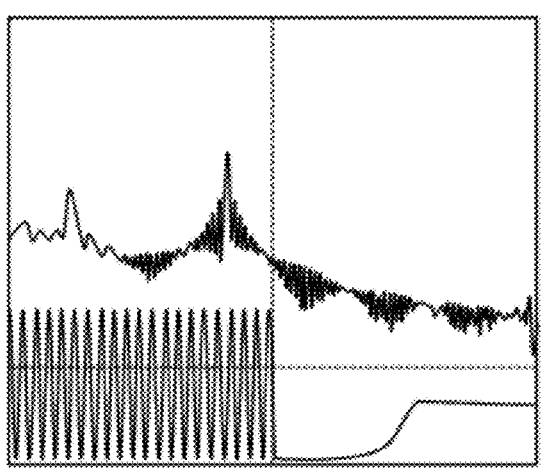

FIGS. 11A-C show oscilloscope traces or curves where a test load 121 is powered by a mains power supply 119. FIG. 11A shows mains voltage where the lower trace is a voltage waveform of the mains supply and the upper curve is an FFT of the mains supply voltage showing a peak at 60 Hz.

FIG. 11B shows a discharge trace resulting from disconnecting a load. Near the left edge of FIG. 11B, the trace is an AC voltage waveform on the load side of the interconnection. As seen here, when the power supply is disconnected from the load at a point of maximum voltage, trace oscillations end and the trace decays sharply, passing through zero volts and recovering asymptotically from a relatively small negative voltage toward zero volts. The duration of this particular load's discharge curve is about 444 milliseconds. This trace illustrates fingerprinting based on the shape and duration of a discharge curve.

FIG. 11C shows in a lower trace voltage on the load side and in an upper trace a FFT of that voltage versus time data. The load is disconnected from the power supply as shown near the midpoint of the chart. Characteristic of this particular load are FFT frequency peaks at 10 and 11 Hz that are not present under normal conditions. This trace illustrates fingerprinting based on frequency content of the discharge curve.

Since data derived from the voltage transducer 204 is available to the processor 110, the voltage data can be collected and analyzed during the shutdown period between times $t_1$ to $t_2$. In an embodiment, a burst sample of voltage "V" data is collected between times $t_1$ and $t_2$. The sample rate should be sufficient to provide a faithful representation of the signal being sampled. For example, in some embodiments the sample rate is greater than two times the highest expected signal frequency to prevent aliasing.

In an embodiment, the time domain voltage data samples are transformed into the frequency domain by a Fourier transform device of the processing unit 304. For example, FIG. 10A shows a signal f(t) in the time domain 1000A and FIG. 10B shows a representation of that signal abs($F_k$) in the frequency domain 1000B with frequency peaks at 1.0, 3.1, 3.5 . . . . In similar fashion, transformation of the voltage samples into the frequency domain produces a set of frequency peaks vf1, vf2, vf3 . . . . Here, these frequency peaks are the voltage fingerprint of the load.

In various embodiments, one or both of the voltage and current fingerprints are used to assess the nature of the load 121. And, in some embodiments, load voltage response is fingerprinted during load energization and load current response is fingerprinted during load de-energization. As before, these voltage response and current response fingerprints may be used in various embodiments, alone, or in combination, to assess the nature of the load.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. A device for assessing a nature of an electrical load comprising:
   a transducer block interposed between a power supply and the electrical load;
   a signal electronics section operative to receive data from the transducer block;
   a dial selector switch for selecting among three or more environmental variables;
   one or more processors operative to create indicia from the data received from the signal electronics section and a state of the dial selector switch;
   a processor of the one or more processors operative to match the indicia with stored indicia; and,
   a processor of the one or more processors operative to assess the nature of the electrical load from the matched indicia.

2. The device of claim 1 wherein the nature of the electrical load includes a type of electrical load.

3. The device of claim 1 wherein the nature of the electrical load includes a model number of the electrical load.

4. The device of claim 1 wherein a first processor analyzes the received data and a second processor identifies a nature of the electrical load.

5. The device of claim 4 wherein the first processor is adjacent to the electrical load in a residence and the second processor is located in a datacenter.

6. The device of claim 1 wherein the indicia include indicia that are derived from load power consumption (watts), power factor, peak current, and root mean square current.

7. The device of claim 6 wherein load power consumption is load standby power consumption and load operating power consumption.

8. The device of claim 1 further including an electrical outlet having a plug insertion switch adjacent to the electrical load and wherein the indicia include indicia derived from state changes of the electrical outlet plug insertion switch.

9. The device of claim 8 wherein the plug insertion switch and dial selector switch are coupled to a housing enclosing the electrical outlet and the electrical outlet is operative to supply the electrical load with electric power.

10. The device of claim 1 wherein the indicia are derived from frequency of use of the electrical load and time duration of uses of the electrical load.

11. The device of claim 1 further including:
an electrical outlet having a single circuit for receiving electric power;
the electrical outlet operative to supply the electrical load with electric power;
an automated switch operative to interrupt power supplied to the electrical outlet;
the transducer block including a current transducer and a voltage transducer; and,
the voltage transducer interposed between the switch and the electrical outlet.

12. The device of claim 1 wherein the indicia include at least one indicium derived from one of a group consisting of load current versus time data collected as operating current initially flows to the electrical load and load voltage versus time data collected as the operating current initially ceases to flow to the electrical load.

13. The device of claim 12 wherein the collected load current versus time data represents a current-time waveform and the collected load voltage versus time data represents a voltage-time waveform.

14. The device of claim 1 wherein the indicia include at least one indicium derived from one of a group consisting of a Fourier transform of load current versus time data collected as operating current initially flows to the electrical load and a Fourier transform of load voltage versus time data collected as the operating current initially ceases to flow to the electrical load.

15. A method for assessing a nature of an electrical load comprising the steps of;
providing a transducer block interposed between a power supply and an electrical load;
providing a signal electronics section operative to receive data from the transducer block;
providing a dial selector switch for selecting among three or more environmental variables;
in one or more processors, determining indicia based on the data received from the signal electronics section and a state of the dial selector switch;
in a processor of the one or more processors, comparing the indicia with stored indicia; and,
in a processor of the one or more processors, assessing the nature of the electrical load based on the compared indicia.

16. The method of claim 15 wherein the nature of the electrical load includes a model number of electrical load.

17. The method of claim 15 wherein a first processor that is adjacent to the electrical load in a residence analyzes the received data and a second processor that is located in a datacenter identifies a nature of the electrical load.

18. The method of claim 15 wherein the indicia include indicia that are derived from state changes of a plug insertion switch associated with an electric outlet adjacent to the electrical load.

19. The method of claim 15 wherein the indicia include at least one indicium derived from one of a group consisting of load current versus time data collected as operating current initially flows to the electrical load and load voltage versus time data collected as the operating current initially ceases to flow to the electrical load.

20. The method of claim 15 wherein the indicia include at least one indicium derived from one of a group consisting of a Fourier transform of load current versus time data collected as operating current initially flows to the electrical load and a Fourier transform of load voltage versus time data collected as the operating current initially ceases to flow to the electrical load.

* * * * *